US 8,405,212 B2
Chu et al.
(45) Date of Patent: Mar. 26, 2013

(12) United States Patent
(10) Patent No.: US 8,405,212 B2

(54) SEMICONDUCTOR PACKAGE

(75) Inventors: Chi-Chih Chu, Kaohsiung (TW); Cheng-Yi Weng, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 259 days.

(21) Appl. No.: 12/818,422

(22) Filed: Jun. 18, 2010

(65) Prior Publication Data
US 2011/0156251 A1 Jun. 30, 2011

(30) Foreign Application Priority Data

Dec. 31, 2009 (TW) ................................ 98146112 A

(51) Int. Cl.
*H01L 23/48* (2006.01)
*H01L 23/52* (2006.01)
*H01L 29/40* (2006.01)
(52) U.S. Cl. ................................ 257/738; 257/E23.021
(58) Field of Classification Search .................. 257/738, 257/E23.021
See application file for complete search history.

(56) References Cited

U.S. PATENT DOCUMENTS

| | | |
|---|---|---|
| 5,072,289 A | 12/1991 | Sugimoto et al. |
| 5,128,831 A | 7/1992 | Fox, III et al. |
| 5,139,610 A | 8/1992 | Dunaway et al. |
| 5,207,585 A | 5/1993 | Byrnes et al. |
| 5,222,014 A | 6/1993 | Lin |
| 5,355,580 A | 10/1994 | Tsukada |
| 5,397,997 A | 3/1995 | Tuckerman et al. |
| 5,400,948 A | 3/1995 | Sajja et al. |
| 5,468,681 A | 11/1995 | Pasch |

(Continued)

FOREIGN PATENT DOCUMENTS

| | | |
|---|---|---|
| JP | 07335783 | 12/1995 |
| JP | 2000294720 | 10/2000 |

(Continued)

OTHER PUBLICATIONS

Wang et al., "Coupled power and thermal cycling reliability of board-level package-on-package stacking assembly." IEEE Trans. Elec. Pkg. Mfg. 32(1): 14-21 (2009).
Lai, et al. "Optimization of thermomechanical reliability of board-level package-on-package stacking assembly." IEEE Tarns. Compon. Pkg. Techn. 29(4): 864-868 (Dec. 2006).
Yoshida et al., A Study on Package Stacking Process for Package-on-Package (PoP) Electronic Components and Tech. Conf. (ECTC), May 2006, San Diego, CA.

(Continued)

*Primary Examiner* — Stephen W Smoot
*Assistant Examiner* — Vicki B Booker
(74) *Attorney, Agent, or Firm* — Foley & Lardner LLP

(57) ABSTRACT

The present invention relates to a semiconductor package. The semiconductor package includes a substrate, at least one chip, a plurality of conductive elements, a plurality of first conductors and a molding compound. The substrate has a plurality of first pads and a solder mask. The first pads are exposed to a first surface of the substrate, and the material of the first pads is copper. The solder mask is disposed on the first surface, contacts the first pads directly, and has at least one opening so as to expose part of the first pads. The chip is mounted on the first surface of the substrate. The conductive elements electrically connect the chip and the substrate. The first conductors are disposed on the first pads. The molding compound is disposed on the first surface of the substrate, and encapsulates the chip, the conductive elements and part of the first conductors. Whereby, the solder mask contacts the first pads directly, and thus results in higher bonding strength, so as to avoid the bridge between the first conductors caused by the first conductors permeating into the interface between the solder mask and the first pads.

20 Claims, 7 Drawing Sheets

U.S. PATENT DOCUMENTS

| | | | |
|---|---|---|---|
| 5,579,207 A | 11/1996 | Hayden et al. | |
| 5,594,275 A | 1/1997 | Kwon et al. | |
| 5,608,265 A | 3/1997 | Kitano et al. | |
| 5,714,800 A | 2/1998 | Thompson | |
| 5,726,493 A | 3/1998 | Yamashita et al. | |
| 5,748,452 A | 5/1998 | Londa | |
| 5,763,939 A | 6/1998 | Yamashita | |
| 5,844,315 A | 12/1998 | Melton et al. | |
| 5,861,666 A | 1/1999 | Bellaar | |
| 5,883,426 A | 3/1999 | Tokuno et al. | |
| 5,889,327 A | 3/1999 | Washida | |
| 5,889,655 A | 3/1999 | Barrow | |
| 5,892,290 A | 4/1999 | Chakravorty et al. | |
| 5,929,521 A | 7/1999 | Wark et al. | |
| 5,973,393 A | 10/1999 | Chia et al. | |
| 5,985,695 A | 11/1999 | Freyman et al. | |
| 6,072,236 A | 6/2000 | Akram et al. | |
| 6,177,724 B1 | 1/2001 | Sawai | |
| 6,194,250 B1 | 2/2001 | Melton et al. | |
| 6,195,268 B1 | 2/2001 | Eide | |
| 6,303,997 B1 | 10/2001 | Lee | |
| 6,448,665 B1 | 9/2002 | Nakazawa et al. | |
| 6,451,624 B1 | 9/2002 | Farnworth et al. | |
| 6,461,881 B1 | 10/2002 | Farnworth et al. | |
| 6,489,676 B2 | 12/2002 | Taniguchi et al. | |
| 6,501,165 B1 | 12/2002 | Farnworth et al. | |
| 6,513,236 B2 | 2/2003 | Tsukamoto | |
| 6,521,995 B1 | 2/2003 | Akram et al. | |
| 6,525,413 B1 | 2/2003 | Cloud et al. | |
| 6,614,104 B2 | 9/2003 | Farnworth et al. | |
| 6,617,687 B2 | 9/2003 | Akram et al. | |
| 6,740,546 B2 | 5/2004 | Corisis et al. | |
| 6,740,964 B2 | 5/2004 | Sasaki | |
| 6,762,503 B2 * | 7/2004 | Lee | 257/781 |
| 6,780,746 B2 | 8/2004 | Kinsman et al. | |
| 6,787,392 B2 | 9/2004 | Quah | |
| 6,798,057 B2 | 9/2004 | Bolkin et al. | |
| 6,812,066 B2 | 11/2004 | Taniguchi et al. | |
| 6,815,254 B2 | 11/2004 | Mistry et al. | |
| 6,828,665 B2 | 12/2004 | Pu et al. | |
| 6,847,109 B2 | 1/2005 | Shim | |
| 6,861,288 B2 | 3/2005 | Shim et al. | |
| 6,888,255 B2 | 5/2005 | Murtuza et al. | |
| 6,924,550 B2 | 8/2005 | Corisis et al. | |
| 6,936,930 B2 | 8/2005 | Wang | |
| 6,974,334 B2 | 12/2005 | Hung | |
| 7,002,805 B2 | 2/2006 | Lee et al. | |
| 7,015,571 B2 | 3/2006 | Chang et al. | |
| 7,026,709 B2 | 4/2006 | Tsai et al. | |
| 7,029,953 B2 | 4/2006 | Sasaki | |
| 7,034,386 B2 | 4/2006 | Kurita | |
| 7,049,692 B2 | 5/2006 | Nishimura et al. | |
| 7,061,079 B2 | 6/2006 | Weng et al. | |
| 7,071,028 B2 | 7/2006 | Koike et al. | |
| 7,129,576 B2 | 10/2006 | Humpston | |
| 7,185,426 B1 | 3/2007 | Hiner et al. | |
| 7,187,068 B2 | 3/2007 | Suh et al. | |
| 7,221,045 B2 | 5/2007 | Park et al. | |
| 7,242,081 B1 | 7/2007 | Lee | |
| 7,262,080 B2 | 8/2007 | Go et al. | |
| 7,279,784 B2 | 10/2007 | Liu | |
| 7,279,789 B2 | 10/2007 | Cheng | |
| 7,288,835 B2 | 10/2007 | Yim et al. | |
| 7,309,913 B2 | 12/2007 | Shim et al. | |
| 7,345,361 B2 | 3/2008 | Mallik et al. | |
| 7,354,800 B2 | 4/2008 | Carson | |
| 7,364,945 B2 | 4/2008 | Shim et al. | |
| 7,364,948 B2 | 4/2008 | Lai et al. | |
| 7,365,427 B2 | 4/2008 | Lu et al. | |
| 7,372,141 B2 | 5/2008 | Karnezos et al. | |
| 7,372,151 B1 | 5/2008 | Fan et al. | |
| 7,394,663 B2 | 7/2008 | Yamashita et al. | |
| 7,408,244 B2 | 8/2008 | Lee et al. | |
| 7,417,329 B2 | 8/2008 | Chuang et al. | |
| 7,429,786 B2 | 9/2008 | Karnezos et al. | |
| 7,429,787 B2 | 9/2008 | Karnezos et al. | |
| 7,436,055 B2 | 10/2008 | Hu | |
| 7,436,074 B2 | 10/2008 | Pan et al. | |
| 7,473,629 B2 | 1/2009 | Tai et al. | |
| 7,485,970 B2 | 2/2009 | Hsu et al. | |
| 7,550,832 B2 | 6/2009 | Weng et al. | |
| 7,550,836 B2 | 6/2009 | Chou et al. | |
| 7,560,818 B2 | 7/2009 | Tsai | |
| 7,586,184 B2 | 9/2009 | Hung et al. | |
| 7,589,408 B2 | 9/2009 | Weng et al. | |
| 7,633,765 B1 | 12/2009 | Scanlon et al. | |
| 7,642,133 B2 | 1/2010 | Wu et al. | |
| 7,671,457 B1 | 3/2010 | Hiner et al. | |
| 7,719,094 B2 | 5/2010 | Wu et al. | |
| 7,723,839 B2 | 5/2010 | Yano et al. | |
| 7,728,431 B2 | 6/2010 | Harada et al. | |
| 7,737,539 B2 | 6/2010 | Kwon et al. | |
| 7,737,565 B2 | 6/2010 | Coffy | |
| 7,777,351 B1 | 8/2010 | Berry et al. | |
| 7,807,512 B2 | 10/2010 | Lee et al. | |
| 7,834,464 B2 | 11/2010 | Meyer et al. | |
| 7,838,334 B2 | 11/2010 | Yu et al. | |
| 8,039,303 B2 | 10/2011 | Shim et al. | |
| 2003/0090883 A1 | 5/2003 | Asahi et al. | |
| 2003/0129272 A1 | 7/2003 | Shen et al. | |
| 2004/0106232 A1 | 6/2004 | Sakuyama et al. | |
| 2004/0124515 A1 | 7/2004 | Tao et al. | |
| 2004/0126927 A1 | 7/2004 | Lin et al. | |
| 2004/0191955 A1 | 9/2004 | Joshi et al. | |
| 2005/0054187 A1 | 3/2005 | Ding et al. | |
| 2005/0117835 A1 | 6/2005 | Nguyen et al. | |
| 2005/0121764 A1 | 6/2005 | Mallik | |
| 2006/0035409 A1 | 2/2006 | Suh et al. | |
| 2006/0170112 A1 | 8/2006 | Tanaka et al. | |
| 2006/0220210 A1 | 10/2006 | Karnezos et al. | |
| 2006/0240595 A1 | 10/2006 | Lee | |
| 2006/0244117 A1 | 11/2006 | Karnezos et al. | |
| 2007/0029668 A1 | 2/2007 | Lin et al. | |
| 2007/0090508 A1 | 4/2007 | Lin et al. | |
| 2007/0108583 A1 | 5/2007 | Shim et al. | |
| 2007/0241453 A1 | 10/2007 | Ha et al. | |
| 2007/0273049 A1 | 11/2007 | Khan et al. | |
| 2007/0290376 A1 | 12/2007 | Zhao et al. | |
| 2008/0017968 A1 | 1/2008 | Choi et al. | |
| 2008/0073769 A1 | 3/2008 | Wu et al. | |
| 2008/0116574 A1 | 5/2008 | Fan | |
| 2008/0230887 A1 | 9/2008 | Sun et al. | |
| 2009/0101400 A1 | 4/2009 | Yamakoshi | |
| 2009/0127686 A1 | 5/2009 | Yang et al. | |
| 2010/0000775 A1 | 1/2010 | Shen et al. | |
| 2010/0032821 A1 | 2/2010 | Pagaila et al. | |
| 2010/0171205 A1 | 7/2010 | Chen et al. | |
| 2010/0171206 A1 | 7/2010 | Chu et al. | |
| 2010/0171207 A1 | 7/2010 | Shen et al. | |
| 2010/0214780 A1 | 8/2010 | Villard | |
| 2010/0244208 A1 | 9/2010 | Pagaila et al. | |
| 2010/0320585 A1 | 12/2010 | Jiang et al. | |
| 2011/0049704 A1 | 3/2011 | Sun et al. | |
| 2011/0068453 A1 | 3/2011 | Cho et al. | |
| 2011/0117700 A1 | 5/2011 | Weng et al. | |
| 2011/0140364 A1 | 6/2011 | Head | |
| 2011/0241193 A1 | 10/2011 | Ding et al. | |
| 2011/0278741 A1 | 11/2011 | Chua et al. | |

FOREIGN PATENT DOCUMENTS

| | | |
|---|---|---|
| JP | 2001298115 | 10/2001 |
| JP | 2002158312 | 5/2002 |
| JP | 2002170906 | 6/2002 |
| JP | 2004327855 | 11/2004 |
| JP | 2009054686 | 3/2009 |
| KR | 20020043435 | 6/2002 |
| KR | 20030001963 | 1/2003 |
| TW | 529155 | 4/2003 |
| TW | 229927 | 3/2005 |
| TW | 200611305 | 4/2006 |

OTHER PUBLICATIONS

Dreiza et al., "High Density PoP (Package-on-Package) and Package Stacking Development" Electronic Components and Technology Conf. (May 2007).

* cited by examiner ly connect the chip and the substrate. The first conductors are disposed on the first pads. The molding compound is disposed on the first surface of the substrate, and encapsulates the chip, the conductive elements and the first conductors. The molding compound has a first top surface and a second top surface. The horizontal level of the first top surface is different from that of the second top surface, and one end of the first conductors is exposed. A top surface of the exposed first conductors is level with the second top surface of the molding compound.

SEMICONDUCTOR PACKAGE

BACKGROUND OF THE INVENTION

1. Field of the Invention

The present invention relates to a semiconductor package, and more particularly to a semiconductor package which can avoid solder bridge.

2. Description of the Related Art

FIGS. 1 to 4 show schematic views of a method for making a conventional semiconductor package. As shown in FIG. 1, a substrate 11 is provided. The substrate 11 has a first surface 111, a second surface 112, a plurality of first pads 113, a plurality of second pads 114, a Ni/Au plating layer 115 and a solder mask 116. The first pads 113 are exposed to the first surface 111. The second pads 114 are exposed to the second surface 112. The Ni/Au plating layer 115 is formed on the entire upper surface of the first pad 113. The solder mask 116 contacts the Ni/Au plating layer 115 directly, and has at least one opening so as to expose part of the Ni/Au plating layers 115. Then, a chip 12 is mounted on the substrate 11, and a plurality of conductive elements (for example, a plurality of wires 13) are formed so as to electrically connect the chip 12 and the first surface 111 of the substrate 11. Then, a plurality of first conductors (for example, a plurality of first solder balls 14) are formed on the Ni/Au plating layer 115.

As shown in FIG. 2, a molding compound 15 is formed on the first surface 111 of the substrate 11, so as to encapsulate the chip 12, the wires 13 and the first solder balls 14. As shown in FIG. 3, a plurality of second solder balls 16 are formed on the second pads 114, and the second solder balls 16 are reflowed. As shown in FIG. 4, part of a periphery area of the molding compound 15 is removed, so that the molding compound 15 has at least two heights, and one end of the first solder balls 14 is exposed. Thus, the conventional semiconductor package 1 is formed.

The conventional semiconductor package 1 has the following disadvantages. First, the solder mask 116 contacts the Ni/Au plating layer 115 directly, however the solder mask 116 and the Ni/Au plating layer 115 has low bonding strength, therefore delamination between the solder mask 116 and the Ni/Au plating layer 115 occurs easily. Moreover, the Ni/Au plating layer 115 disposed on the first solder balls 14 is encapsulated by the molding compound 15, and when the second solder balls 16 are reflowed, the first solder balls 14 expand because of high temperature. Meanwhile, the first solder balls 14 extrude to adjacent elements and protrude to the interface between the solder mask 116 and the Ni/Au plating layer 115 which has low bonding strength. As a result, it leads to the bridge between the first solder balls 14, as shown in area A of FIGS. 3 to 5, and the yield rate of the semiconductor package is decreased.

Therefore, it is necessary to provide a semiconductor package to solve the above problems.

SUMMARY OF THE INVENTION

The present invention is directed to a semiconductor package. The semiconductor package comprises a substrate, at least one chip, a plurality of conductive elements, a plurality of first conductors and a molding compound. The substrate has a first surface, a second surface, a plurality of first pads and a solder mask. The first pads are exposed to the first surface, and the material of the first pads is copper. The solder mask directly contacts the first pads, and has at least one opening so as to expose part of the first pads. The chip is mounted on the substrate. The conductive elements electri- The present invention is further directed to a semiconductor package. The semiconductor package comprises a substrate, at least one chip, a plurality of conductive elements, a plurality of first conductors and a molding compound. The substrate has a first surface, a second surface, a plurality of first pads and a solder mask. The first pads are exposed to the first surface, and the material of the first pads is copper. The solder mask directly contacts the first pads, and has at least one opening so as to expose part of the first pads. The chip is mounted on the substrate. The conductive elements electrically connect the chip and the substrate. The first conductors are disposed on the first pads. The molding compound is disposed on the first surface of the substrate, and encapsulates the chip, the conductive elements and part of the first conductors. The molding compound has a first surface and a plurality of blind holes. The blind holes open at the first surface of the molding compound, and expose part of the first conductors.

Whereby, the solder mask contacts the first pads directly, and thus results in higher bonding strength, so as to avoid the bridge between the first conductors caused by the first conductors permeating into the interface between the solder mask and the first pads.

DETAILED DESCRIPTION OF THE INVENTION

Figure 1:
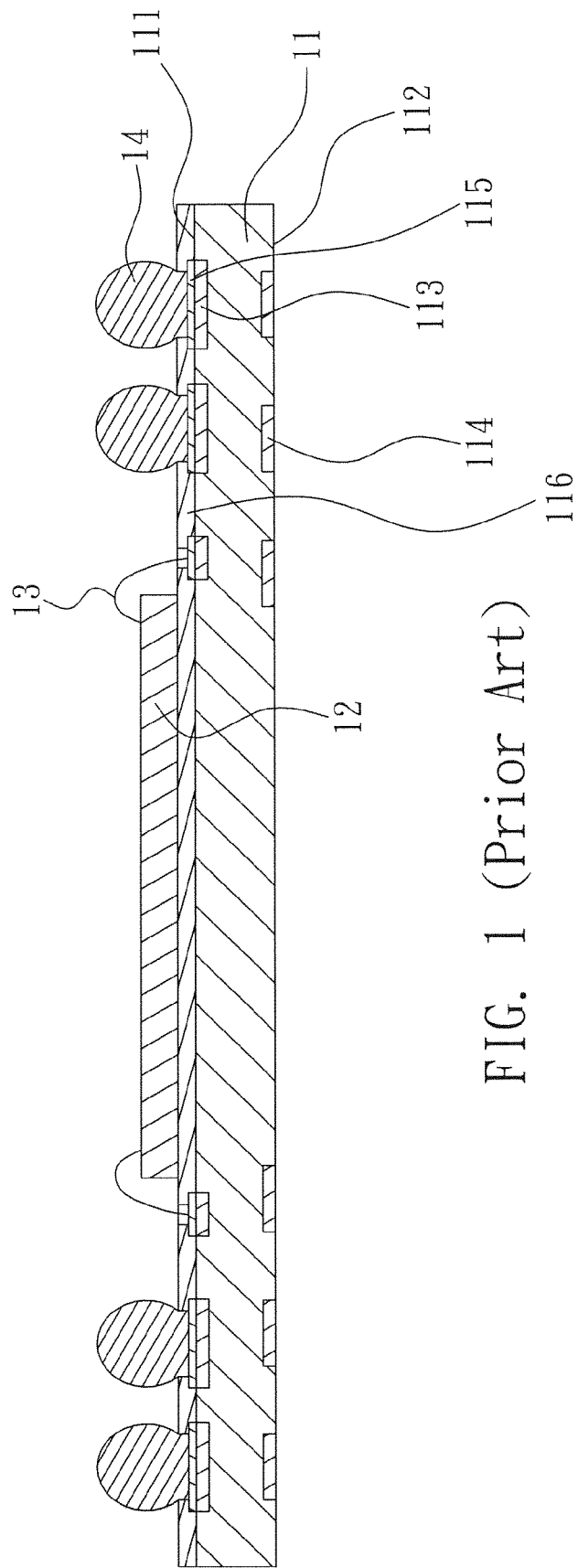
FIGS. 1 to 4 are schematic views of a method for making a conventional semiconductor package.
Figure 2:
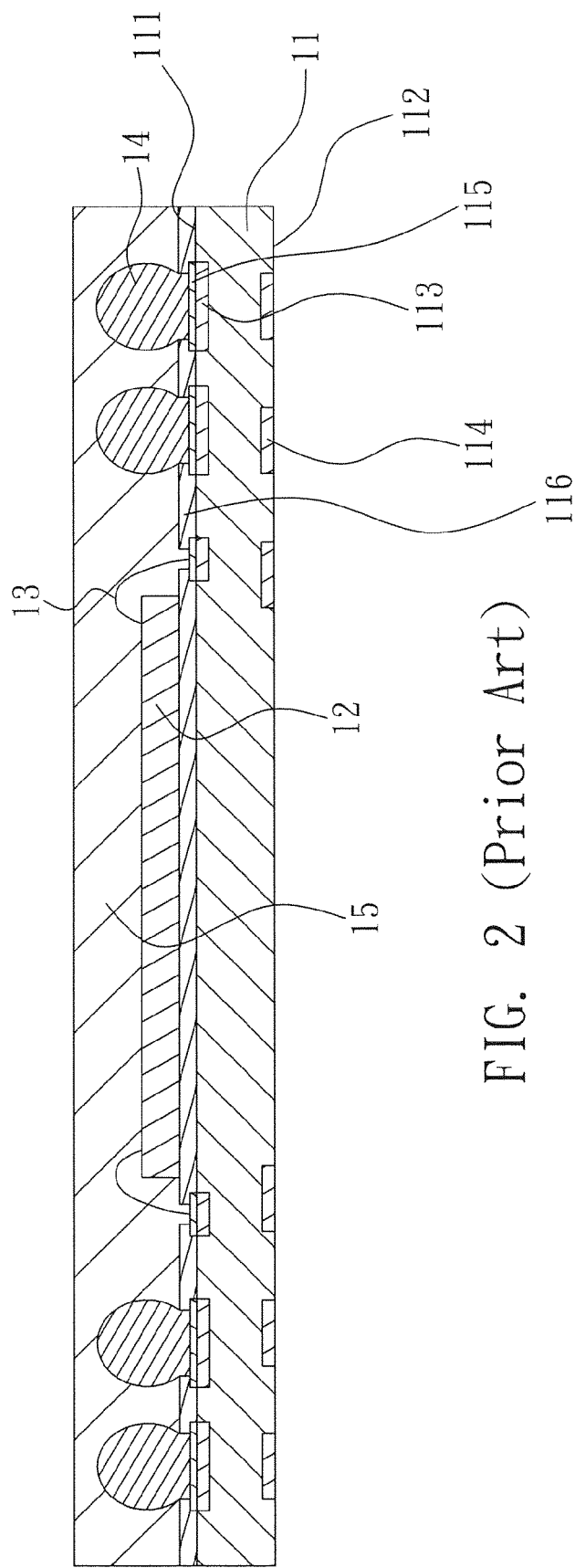
Figure 3:
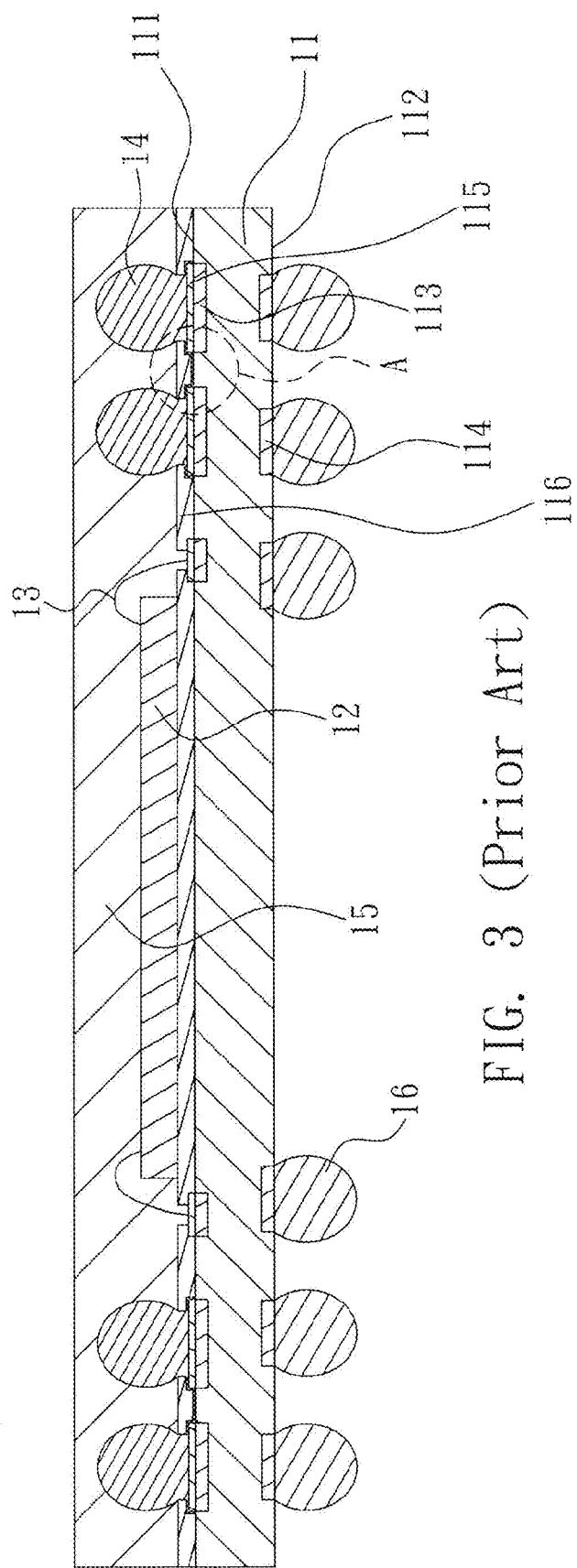
Figure 4:
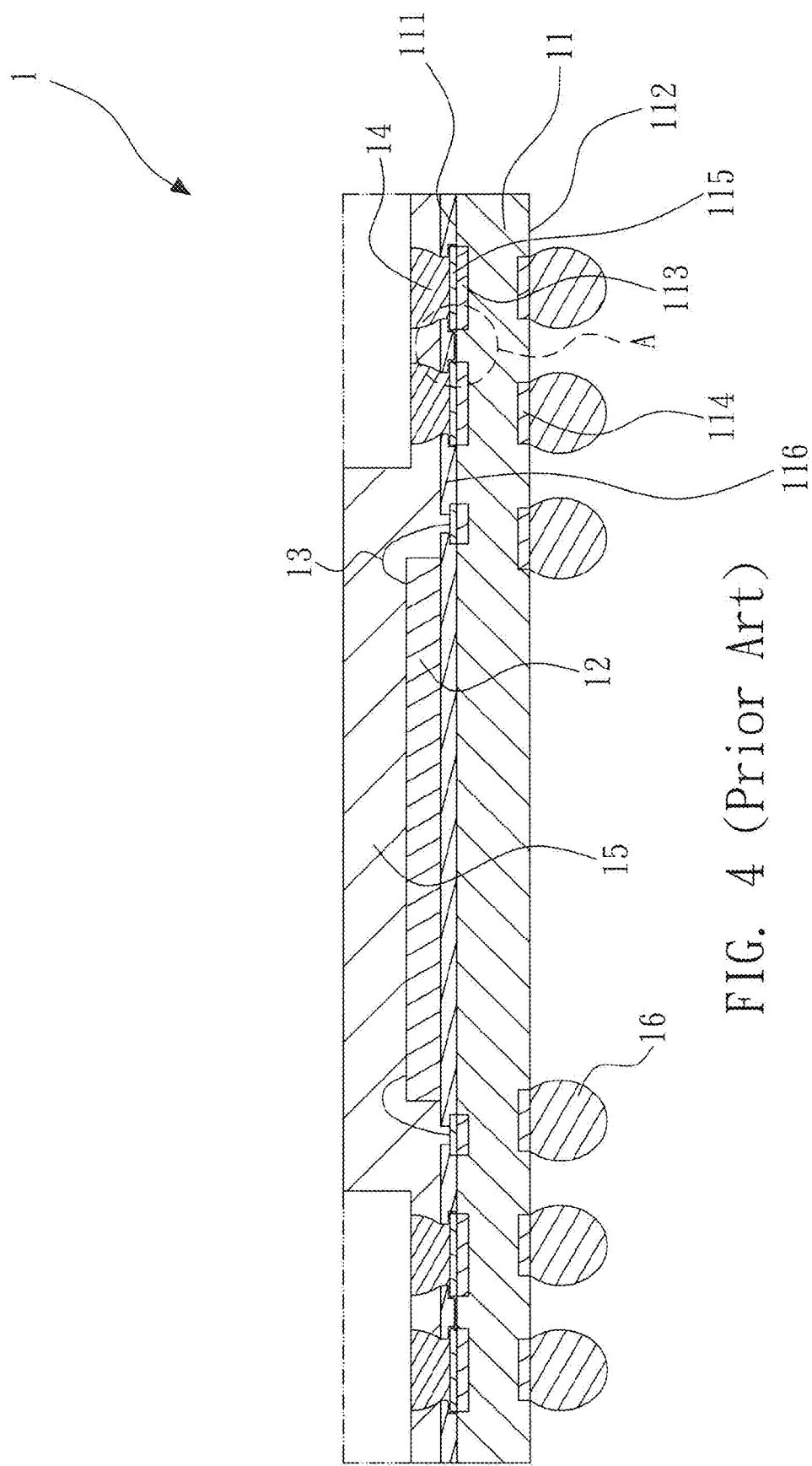
Figure 5:
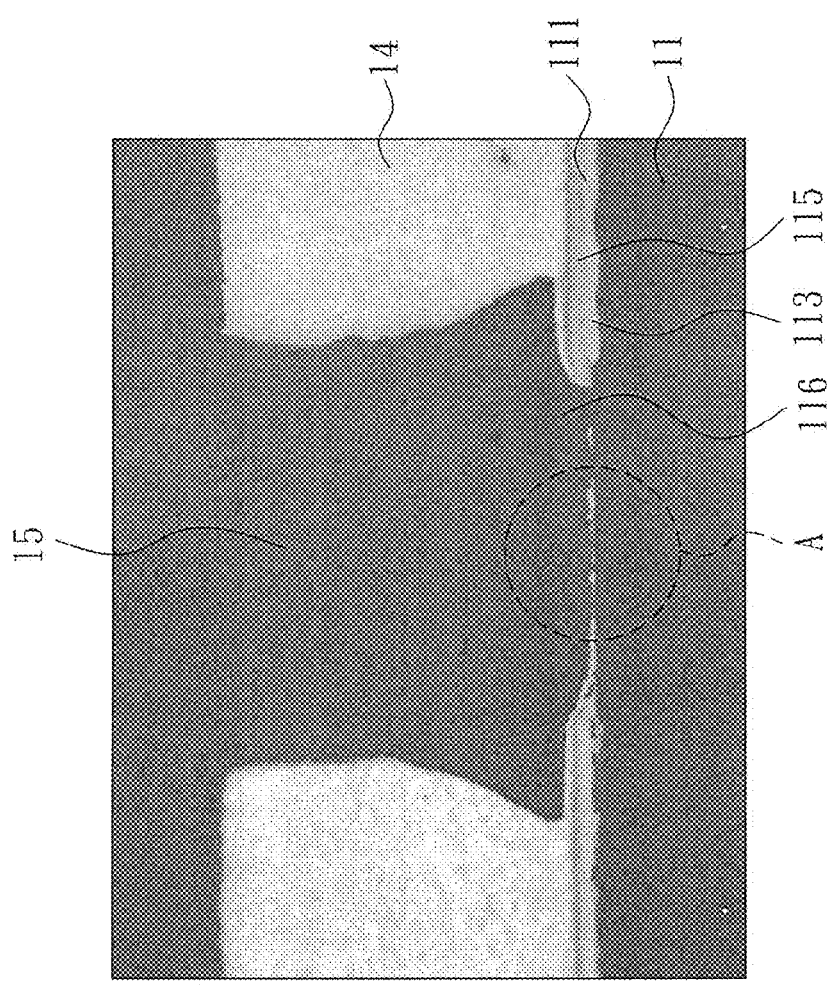
FIG. 5 is a partially enlarged photograph of FIG. 4.
Figure 6:
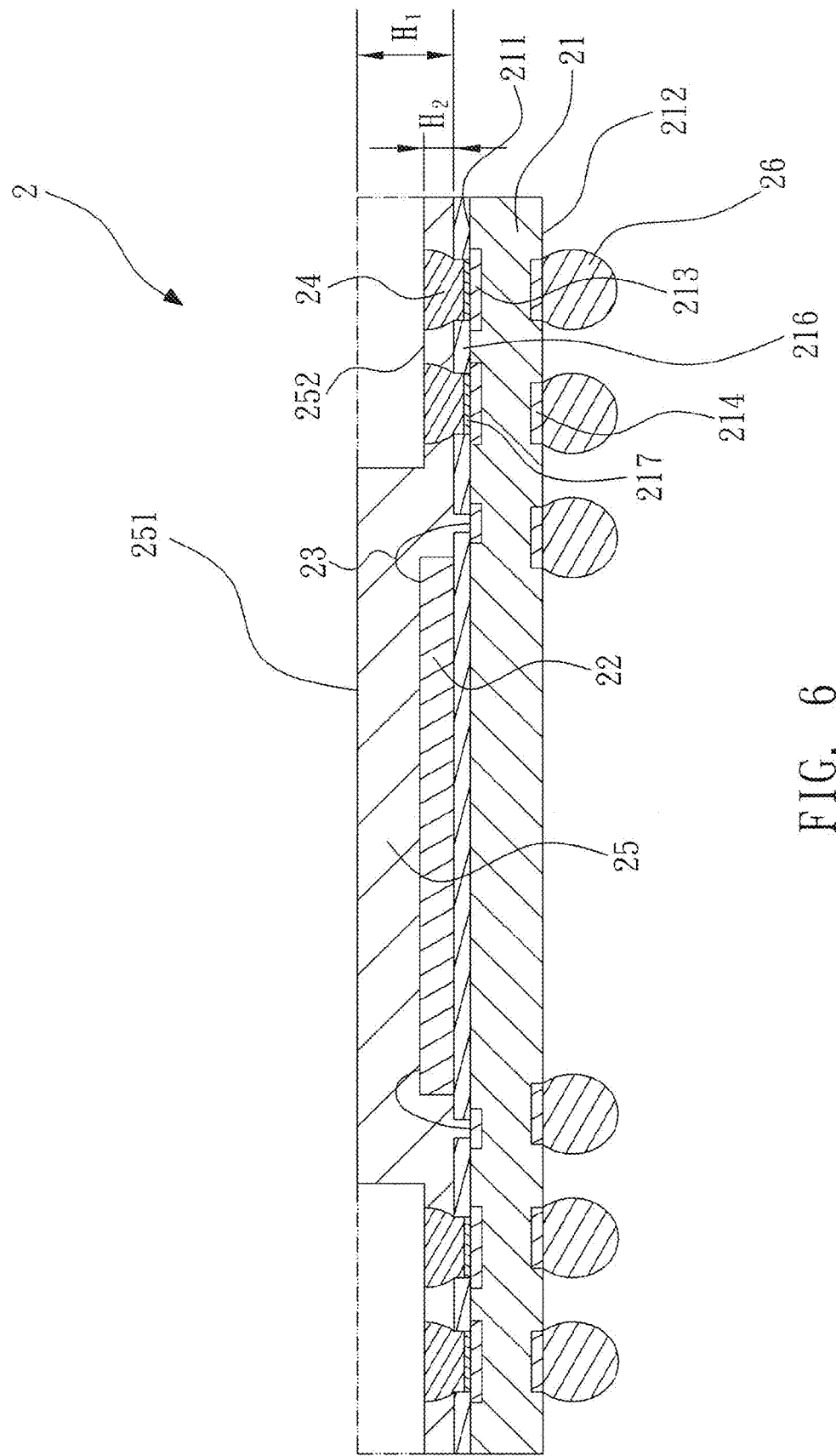
FIG. 6 is a cross-sectional view of a semiconductor package according to a first embodiment of the present invention.

FIG. 6 shows a cross-sectional view of a semiconductor package according to a first embodiment of the present invention. The semiconductor package 2 comprises a substrate 21, at least one chip 22, a plurality of conductive elements (for example, a plurality of wires 23), a plurality of first conductors (for example, a plurality of first solder balls 24), a molding compound 25 and a plurality of second solder balls 26. The substrate 21 has a first surface 211, a second surface 212, a plurality of first pads 213, a plurality of second pads 214, a solder mask 216 and an anti-oxidation layer 217.

The first pads 213 are exposed to the first surface 211, and the material of the first pads 213 is copper. The second pads 214 are exposed to the second surface 212. The solder mask 216 contacts the first pads 213 directly, and has at least one opening so as to expose part of the first pads 213. The anti-oxidation layer 217 is disposed on the first pads 213 exposed to the opening of the solder mask 216. That is, the anti-oxidation layer 217 does not completely cover the entire upper surface of the first pad 213. In the embodiment, the anti-oxidation layer 217 is a Ni/Au plating layer. However, in other applications, the anti-oxidation layer 217 can be an organic solderability preservative (OSP), and the anti-oxidation layer 217 does not exist in the final structure. Therefore, the present invention can avoid the first pads 213 from oxidizing after being exposed in the air, and thus the yield rate of the semiconductor package is increased.

The chip 22 is mounted on the substrate 21. In the embodiment, the chip 22 is adhered to the solder mask 216. In the present invention, the form of the chip 22 has no limitation. The wires 23 electrically connect the chip 22 and the substrate 21. The first solder balls 24 are disposed on the first pads 213, preferably, the first solder balls 24 are hemispheres. The second solder balls 26 are disposed on the second pads 214.

The molding compound 25 is disposed on the first surface 211 of the substrate 21, and encapsulates the chip 22, the wires 23 and the first solder balls 24. The molding compound 25 has a first top surface 251 and a second top surface 252, the horizontal level of the first top surface 251 is different from that of the second top surface 252, and one end of the first solder balls 24 is exposed. A top surface of the exposed first solder balls 24 is level with the second top surface 252 of the molding compound 25.

The molding compound 25 has a first height $H_1$ and a second height $H_2$, the first height $H_1$ is the height from the first top surface 251 to the solder mask 216, the second height $H_2$ is the height from the second top surface 252 to the solder mask 216, and the first height $H_1$ is greater than the second height $H_2$.

Figure 7:
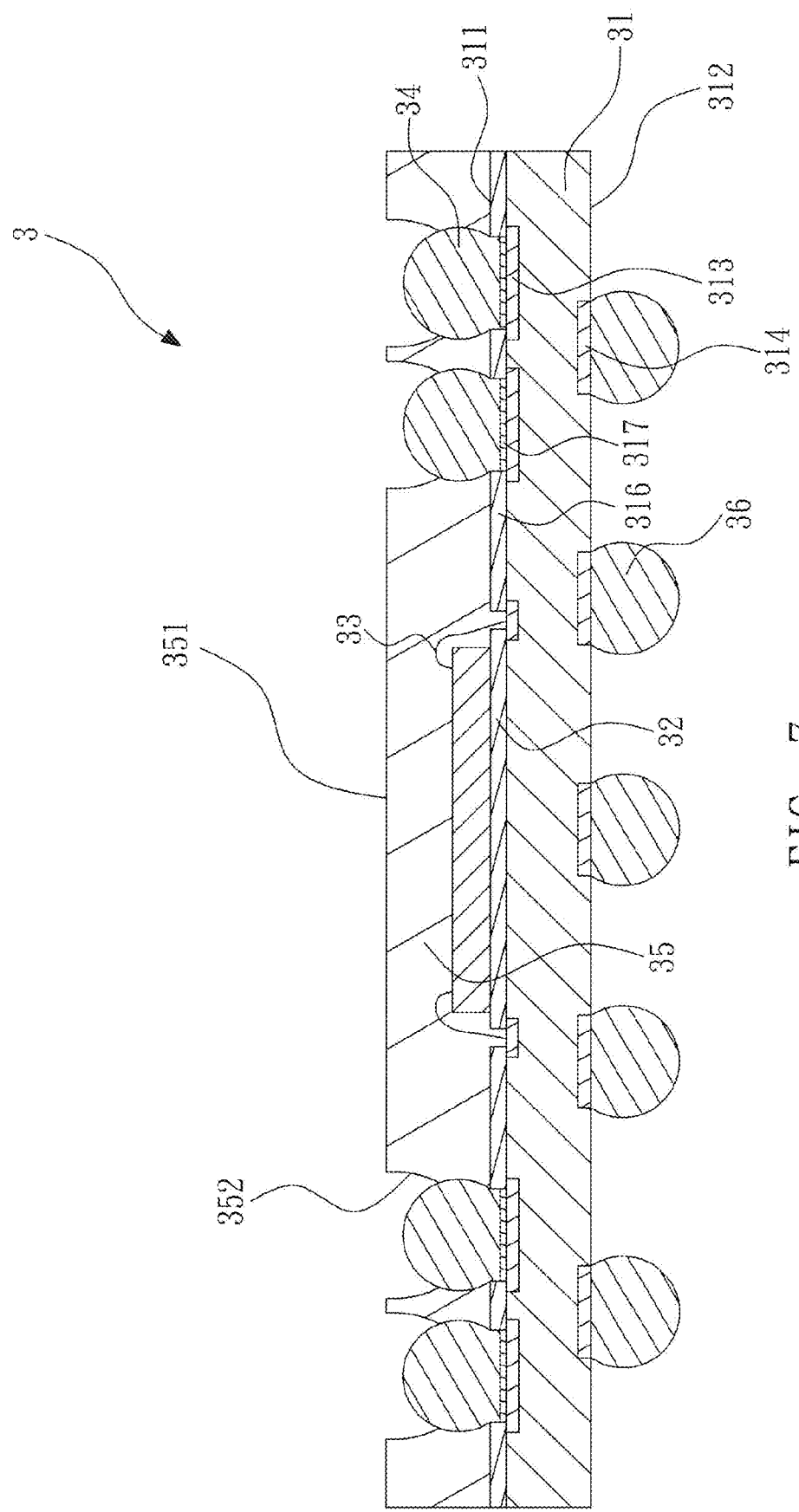
FIG. 7 is a cross-sectional view of a semiconductor package according to a second embodiment of the present invention.

FIG. 7 shows a cross-sectional view of a semiconductor package according to a second embodiment of the present invention. The semiconductor package 3 comprises a substrate 31, at least one chip 32, a plurality of conductive elements (for example, a plurality of wires 33), a plurality of first conductors (for example, a plurality of first solder balls 34), a molding compound 35 and a plurality of second solder balls 36. The substrate 31 has a first surface 311, a second surface 312, a plurality of first pads 313, a plurality of second pads 314, a solder mask 316 and an anti-oxidation layer 317.

The first pads 313 are exposed to the first surface 311, and the material of the first pads 313 is copper. The second pads 314 are exposed to the second surface 312. The solder mask 316 contacts the first pads 313 directly, and has at least one opening so as to expose part of the first pads 313. The anti-oxidation layer 317 is disposed on the first pads 313 exposed to the opening of the solder mask 316, preferably, the anti-oxidation layer 317 is an organic solderability preservative (OSP) or a Ni/Au plating layer. Therefore, the present invention can avoid the first pads 313 from oxidizing after being exposed in the air, and thus the yield rate of the semiconductor package is is increased.

The chip 32 is mounted on the substrate 31. In the embodiment, the chip 32 is adhered to the solder mask 316. In the present invention, the form of the chip 32 has no limitation. The wires 33 electrically connect the chip 32 and the substrate 31. The first solder balls 34 are disposed on the first pads 313. The second solder balls 36 are disposed on the second pads 314. The molding compound 35 is disposed on the first surface 311 of the substrate 31, and encapsulates the chip 32, the wires 33 and part of the first solder balls 34. The molding compound 35 has a first surface 351 and a plurality of blind holes 352. The blind holes 352 open at the first surface 351 of the molding compound 35, and expose part of the first solder balls 34.

Therefore, the solder masks 216, 316 contact the first pads 213, 313 directly, and thus results in higher bonding strength, so as to avoid the bridge between the first conductors (the first solder balls 24, 34) caused by the first conductors (the first solder balls 24, 34) permeating into the interface between the solder masks 216, 316 and the first pads 213, 313.

While several embodiments of the present invention have been illustrated and described, various modifications and improvements can be made by those skilled in the art. The embodiments of the present invention are therefore described in an illustrative but not restrictive sense. It is intended that the present invention should not be limited to the particular forms as illustrated, and that all modifications which maintain the spirit and scope of the present invention are within the scope defined by the appended claims.

What is claimed is:

1. A semiconductor package, comprising:
    a substrate, comprising a top surface, a pad and a solder mask, wherein the pad is disposed adjacent to the top surface of the substrate, and the solder mask overlies and directly contacts a part of the pad and defines a first opening so as to expose a remaining part of the pad;
    at least one chip, mounted on the substrate;
    a plurality of conductive elements, electrically connecting the chip and the substrate;
    a conductor, disposed over the pad; and
    a molding compound, disposed on the top surface of the substrate, wherein the molding compound defines a second opening so as to expose a remaining part of the conductor and a top end of the conductor is recessed below a top surface of the molding compound, and wherein the second opening has a side surface extending from the top surface of the molding compound to the conductor, and the side surface is curved.

2. The semiconductor package as claimed in claim 1, wherein the substrate further comprises a plating layer that is disposed on the remaining part of the pad exposed by the first opening of the solder mask.

3. The semiconductor package as claimed in claim 2, wherein a width of the plating layer is smaller than a width of the pad.

4. The semiconductor package as claimed in claim 2, wherein the plating layer comprises at least one of gold and nickel.

5. The semiconductor package as claimed in claim 1, wherein a bottom surface of the solder mask is substantially coplanar with a top surface of the pad.

6. The semiconductor package as claimed in claim 1, wherein a width of the second opening at the top surface of the molding compound is greater than a width of the conductor.

7. The semiconductor package as claimed in claim 1, wherein the pad comprises copper.

8. A semiconductor package, comprising:
    a substrate comprising a top surface, a pad, and a solder mask, wherein a bottom surface of the solder mask is substantially coplanar with a top surface of the pad, and wherein the solder mask defines a first opening that partially exposes the pad to define a covered portion and an uncovered portion of the pad;
    a conductor disposed over the uncovered portion of the pad; and
    a molding compound disposed over the top surface of the substrate, wherein the molding compound comprises a top surface and defines a second opening that exposes a top end of the conductor, and the top end of the conductor is recessed below the top surface of the molding compound.

9. The semiconductor package as claimed in claim 8, wherein the solder mask directly contacts the covered portion of the pad.

10. The semiconductor package as claimed in claim 8, wherein the covered portion of the pad is adjacent to a periphery of the pad.

11. The semiconductor package as claimed in claim 8, wherein the conductor is solder.

12. The semiconductor package as claimed in claim 8, wherein the substrate further comprises an anti-oxidation layer disposed over the uncovered portion of the pad.

13. The semiconductor package as claimed in claim 12, wherein the anti-oxidation layer is inwardly recessed from a periphery of the pad.

14. The semiconductor package as claimed in claim 8, wherein a width of the first opening at a top surface of the solder mask is substantially the same as a width of the first opening adjacent to the pad.

15. A semiconductor package, comprising:
- a substrate comprising a top surface, a pad, and a solder mask, wherein the pad is disposed adjacent to the top surface of the substrate, and the solder mask extends over a peripheral part of the pad while a central part of the pad is exposed;
- a chip disposed over the top surface of the substrate;
- a conductor disposed over the central part of the pad; and
- a molding compound disposed over the top surface of the substrate, wherein the molding compound comprises a top surface and defines an opening that at least partially exposes the conductor, and a width of the opening at the top surface of the molding compound is at least as large as a width of the conductor.

16. The semiconductor package as claimed in claim 15, wherein the solder mask directly contacts the peripheral part of the pad.

17. The semiconductor package as claimed in claim 15, wherein the width of the opening at the top surface of the molding compound is greater than the width of the conductor.

18. The semiconductor package as claimed in claim 15, wherein a top end of the conductor is recessed below the top surface of the molding compound.

19. The semiconductor package as claimed in claim 15, wherein the substrate further comprises a plating layer extending over the central part of the pad but without extending over the peripheral part of the pad.

20. The semiconductor package as claimed in claim 15, wherein the opening has a side surface extending from the top surface of the molding compound to the conductor, and the side surface is curved.

* * * * *